(12) United States Patent
Arvin et al.

(10) Patent No.: US 11,031,343 B2
(45) Date of Patent: Jun. 8, 2021

(54) FINS FOR ENHANCED DIE COMMUNICATION

(71) Applicant: International Business Machines Corporation, Armonk, NY (US)

(72) Inventors: Charles Leon Arvin, Poughkeepsie, NY (US); Richard Francis Indyk, Saratoga Springs, NY (US); Bhupender Singh, Fishkill, NY (US); Jon Alfred Casey, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/448,182

(22) Filed: Jun. 21, 2019

(65) Prior Publication Data

US 2020/0402912 A1     Dec. 24, 2020

(51) Int. Cl.
*H01L 23/538* (2006.01)
*H01L 25/065* (2006.01)

(52) U.S. Cl.
CPC ...... *H01L 23/5386* (2013.01); *H01L 25/0655* (2013.01)

(58) Field of Classification Search
CPC .................. H01L 23/5386; H01L 23/0655
See application file for complete search history.

(56) References Cited

U.S. PATENT DOCUMENTS

| 3,525,910 | A |   | 8/1970 | Philips |
|---|---|---|---|---|
| 5,300,815 | A | * | 4/1994 | Rostoker ........... H01L 23/49503 257/786 |
| 9,437,493 | B2 |   | 9/2016 | Grivna et al. |
| 9,548,274 | B1 |   | 1/2017 | Yu et al. |
| 9,806,030 | B2 |   | 10/2017 | Kulick et al. |
| 2005/0024958 | A1 | * | 2/2005 | Masui ................ H01L 25/0655 365/200 |
| 2014/0299999 | A1 | * | 10/2014 | Hu .......................... H01L 24/19 257/774 |
| 2015/0364422 | A1 | * | 12/2015 | Zhai .................... H01L 23/5385 257/773 |
| 2016/0005655 | A1 | * | 1/2016 | Grivna .............. H01L 21/30655 257/620 |
| 2018/0102343 | A1 |   | 4/2018 | Lin et al. |

FOREIGN PATENT DOCUMENTS

WO          03/096406 A1     11/2003

* cited by examiner

*Primary Examiner* — Dale E Page
*Assistant Examiner* — Quovaunda Jefferson
(74) *Attorney, Agent, or Firm* — Scully, Scott, Murphy & Presser, P.C.; L. Jeffrey Kelly, Esq.

(57) ABSTRACT

Semiconductor structures are provided in which a first chip on a substrate has at least one first protruding section, the first protruding section including first interconnect locations, a second chip on the substrate having at least one second protruding section, the second protruding section including second interconnect locations and the first chip and the second chip are arranged such that the first protruding section is interdigitated with the second protruding section.

10 Claims, 6 Drawing Sheets

FINS FOR ENHANCED DIE COMMUNICATION

BACKGROUND

The present application relates in general to semiconductor chip packages. More specifically, the present application relates to fabrication methods and resulting structures for a semiconductor chip package having an increased surface area between that semiconductor chip package and an adjacent semiconductor chip package.

A semiconductor chip, also commonly referred to as an integrated circuit (IC) chip or a die is typically assembled into a semiconductor chip package that is soldered to some form of substrate such as organic, ceramic, glass, semiconductor such as silicon, full wafer, etc. Many times the organic substrate is referred to as a printed circuit board. One type of semiconductor chip package is a flip chip, also known as a controlled collapse chip connection ("C4") package. The semiconductor chip package typically includes the IC chip, which contains a number of solder bumps that are attached to a top surface of the chip. The IC chip, via the solder bumps, is soldered to solder pads located along a surface of a package substrate, forming a metallurgical joint between the chip and the substrate. On package I/O (OPIO), optics, and multi chip modules (MCM) are becoming key components for enabling next generation semiconductor chip packaging, especially for server systems.

Communication between adjacent semiconductor chips is typically a factor of the surface area of contact between the adjacent dies. There is thus a need for increasing surface area between adjacent semiconductor chips to increase communication between them, without making the semiconductor chips themselves larger.

SUMMARY

One aspect of the present application relates to semiconductor structures that include a first chip on a wafer having at least one first protruding section, the first protruding section including first interconnect locations, a second chip on the wafer having at least one second protruding section, the second protruding section including second interconnect locations, wherein the first chip and the second chip are arranged such that the first protruding section is interdigitated with the second protruding section.

In another embodiment, the semiconductor structure includes a first chip on a wafer having at least one first protruding section, the first protruding section including first interconnect locations and a second chip on the wafer having at least one second protruding section, the second protruding section including second interconnect locations, wherein the first chip includes a first PCI (peripheral component interconnect) and the second chip includes a second PCI. PCI by definition is related to component bus interconnect. For the purpose of this disclosure, it can refer to any bus configuration between chips or for connection with components such as high bandwidth memory (HBM) devices.

In another embodiment, the semiconductor structure includes a first chip on a wafer having at least one first protruding section, the first protruding section including first interconnect locations, a second chip on the wafer having at least one second protruding section, the second protruding section including second interconnect locations and a bridge connected to the first chip and connected to the second chip, wherein the first chip and the second chip are arranged such that the first protruding section is interdigitated with the second protruding section.

BRIEF DESCRIPTION OF SEVERAL VIEWS OF THE DRAWINGS

The disclosure will provide details in the following description of embodiments with reference to the following figures wherein.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

Various embodiments of the present application are described herein with reference to the related drawings. Alternative embodiments can be devised without departing from the scope of this application. It is noted that various connections and positional relationships (e.g., over, below, adjacent, etc.) are set forth between elements in the following description and in the drawings. These connections and/or positional relationships, unless specified otherwise, can be direct or indirect, and the present application is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

As used herein, the terms "about," "substantially," "approximately," and variations are intended to include the degree of error associated with measurement of the particular quantity based upon the equipment available at the time of filing the application. For example, "about" can include a range of ±8% or 5%, or 2% of a given value.

As used herein, the term "interdigitated" indicates at least two chips, wherein each chip includes (i) one or more protruding portions that extend onto one or more receiving sections of an adjacent chip, and/or (ii) one or more receiving sections that are configured to receive one or more protruding sections of an adjacent chip. The distances between protruding sections and receiving sections of adjacent chips can be any distance greater than the protruding portions and receiving sections contacting each other.

The various tasks and process steps described herein can be incorporated into a more comprehensive procedure or process having additional steps or functionality not described in detail herein.

In all figures discussed below, a plan view of two or more dies are shown on a semiconductor wafer.

Each semiconductor chip on each wafer discussed below may have the same shape or may have different shapes. The chips are separated from each other by portions of wafer that will be removed, such as singulation regions, in order to singulate each chip. Singulation regions surround each chip on each wafer so that the singulation regions of wafer may be removed in order to singulate the chip. Each chip on each wafer may be formed as any type of semiconductor chip including a diode, a vertical transistor, a lateral transistor, or an integrated circuit that includes a variety of types of semiconductor devices.

Figure 1:
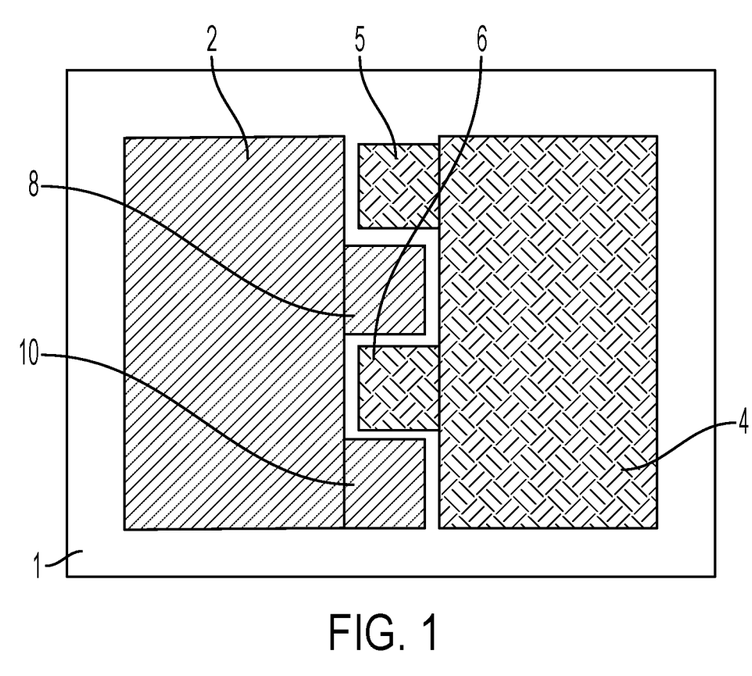
FIG. 1 is a plan view of two interdigitated chips on a substrate.

One embodiment of the disclosure is shown in FIG. 1. In FIG. 1, a first chip 2 and a second chip 4 are on a wafer are shown. The first chip 2 and the second chip 4 are attached to the substrate 1 in any suitable way, such as by a mass solder reflow process or by thermal compression bonding.

As can be seen, the second chip 4 includes a second chip first protruding portion 5 and a second chip second protruding portion 6. The first chip 2 includes a first chip first protruding portion 8 and a first chip second protruding portion 10. Although not shown, portions of the first chip 2 and the second chip 4 (including at least some portions of the first chip first protruding portion 8, the first chip second protruding portion 10, the second chip first protruding portion 5 and the second chip second protruding portion 6) can contain first interconnects (being located on the first chip 2) and second interconnects (being located on the second chip 4). Similarly, protruding portions of other embodiments discussed below can include interconnects.

To create the shapes of the first chip 2, the second chip first protruding portion 5, the second chip second protruding portion 6, the second chip 4, the first chip first protruding portion 8 and the first chip second protruding portion 10, any suitable method may be used. For example, laser on-off pulsing and stealth dicing can be used to form these shapes. In other embodiments, a plasma process can be used to create any shape of the above features, even if they include curved portions near corners of any shape. Similarly, any portions of the chips and protruding portions discussed below can also be formed and/or curved by the above discussed methods.

Figure 2:
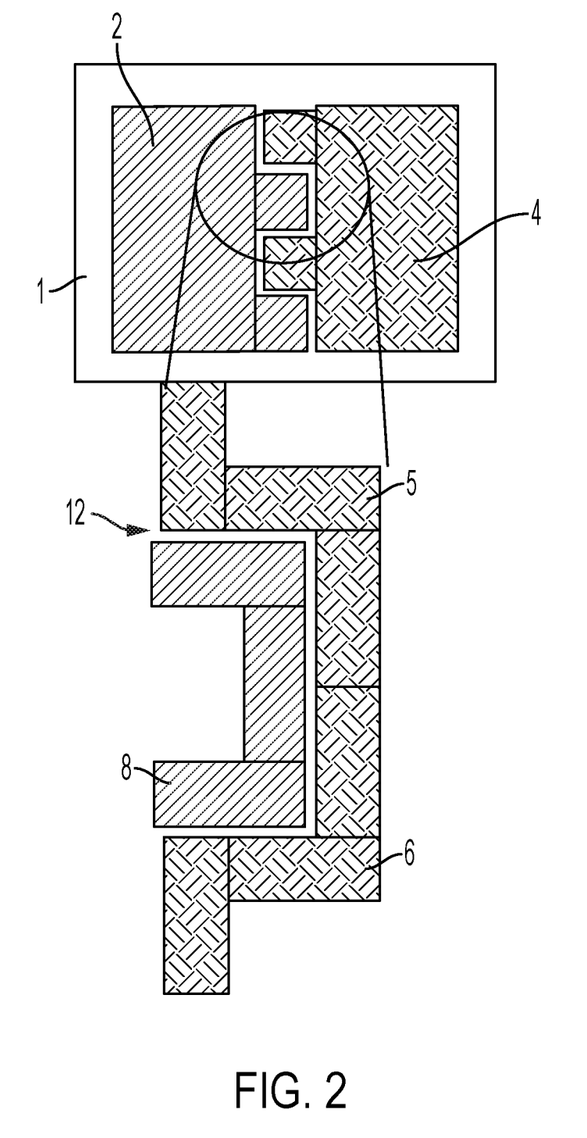
FIG. 2 is a magnified view of a portion of FIG. 1.

A magnified view of a portion of FIG. 1 is shown in FIG. 2. In FIG. 2, just boundary regions of the second chip first protruding portion 5, the second chip second protruding portion 6 and the first chip first protruding portion 8 are shown. As can be seen the first chip first protruding portion 8 extends into a receiving section 12 created by the area between the second chip first protruding portion 5 and the second chip second protruding portion 6. Thus, the first chip 2 is interdigitated with the second chip 4 by the placement of the first chip first protruding portion 8 in the receiving section 12. Each receiving section, such as receiving section 12, can be formed by three edges (as receiving section 12 is, by the edge of the second chip first protruding portion 5, the edge of the second chip 4 and the edge of the second chip second protruding portion 6), or, each receiving section can be formed by two edges (as the lower receiving section of FIG. 2 is, by the edge of the first chip 2 and the edge of the first chip second protruding portion 10).

The near proximity of the first chip first protruding portion 8, in the receiving section 12, with the second chip first protruding portion 5, the second chip second protruding portion 6, and the second chip 4 increases both the ability to transmit signals and receive signals for both the first chip 2 and the second chip 4.

As can be seen in FIG. 2, the surface area between the first chip and the second chip (along the lengths of each protruding portion and each receiving section) is much higher than if each of the first chip 2 and the second chip 2 had no protruding portions or receiving sections.

Figure 3:
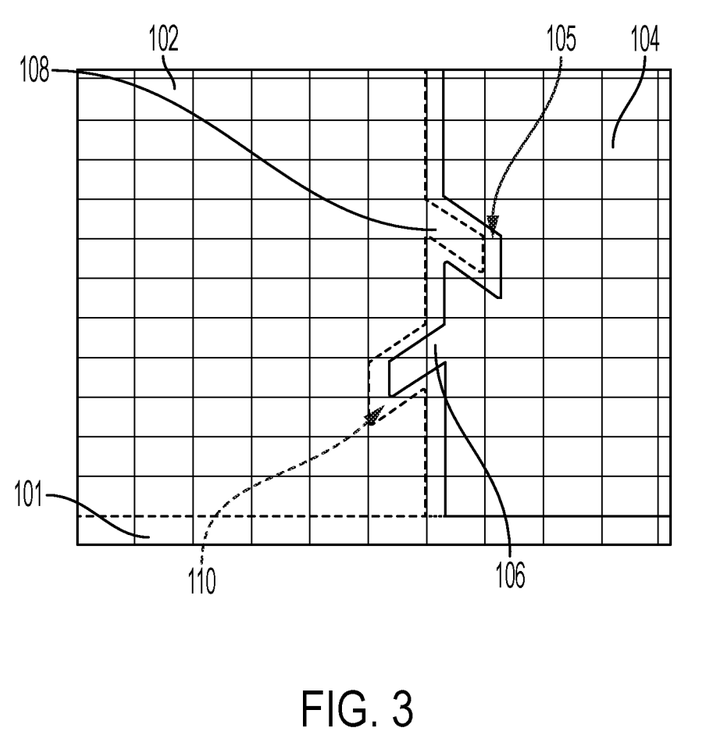
FIG. 3 is a plan view of a portion of two interdigitated chips on a wafer.

Another embodiment of two chips is shown in FIG. 3. A first chip 102 and a second chip 104 are interdigitated, but, in this embodiment, the respective protruding portions are not at about 900 from a surface of each chip, but about 45 from the surface of each chip.

The first chip 102 includes a first chip protruding portion 108 that extends, at an angle of about 45°, into a second chip receiving section 105. Also, a second chip protruding portion 106 extends, at an angle of about 45°, into a first chip receiving section 110. Although the angles of these components are noted and shown to be about 45°, in other embodiments, any suitable angle between 0° and about 90° can be used.

Figure 4:
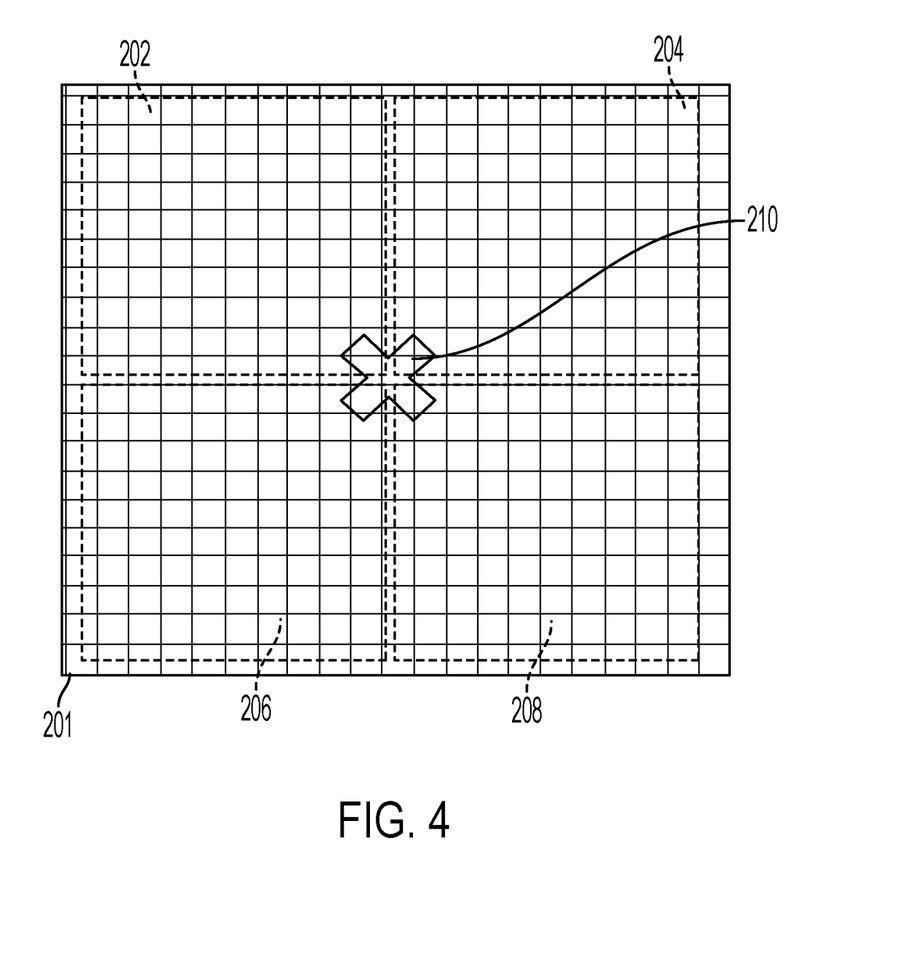
FIG. 4 is a plan view of four interdigitated chips on a wafer.

FIG. 4 is another embodiment, illustrating how four different chips can be interdigitated. In this embodiment four chips on a wafer 201 are shown, a first chip 202, a second chip 204, a third chip 206 and a fourth chip 208. A substantially x-shaped protruding portion 210 extends into corresponding receiving sections of each chip. In other embodiments, various other shapes that could extend into any formed receiving sections of each of the chips could replace the x-shaped protruding portion 210.

However FIG. 4 only illustrates one example, in other embodiments, the linear edges of each of the four chips may be interdigitated in a way similar to that illustrated in FIGS. 1-3. In still other embodiments, three chips, five chips or more chips may be interdigitated in any way discussed herein.

In each figure and embodiment discussed above, the structure has resulted in an increased chip to chip communication. In the embodiment shown in FIG. 5, the structure results in an increased chip to substrate communication.

Figure 5:
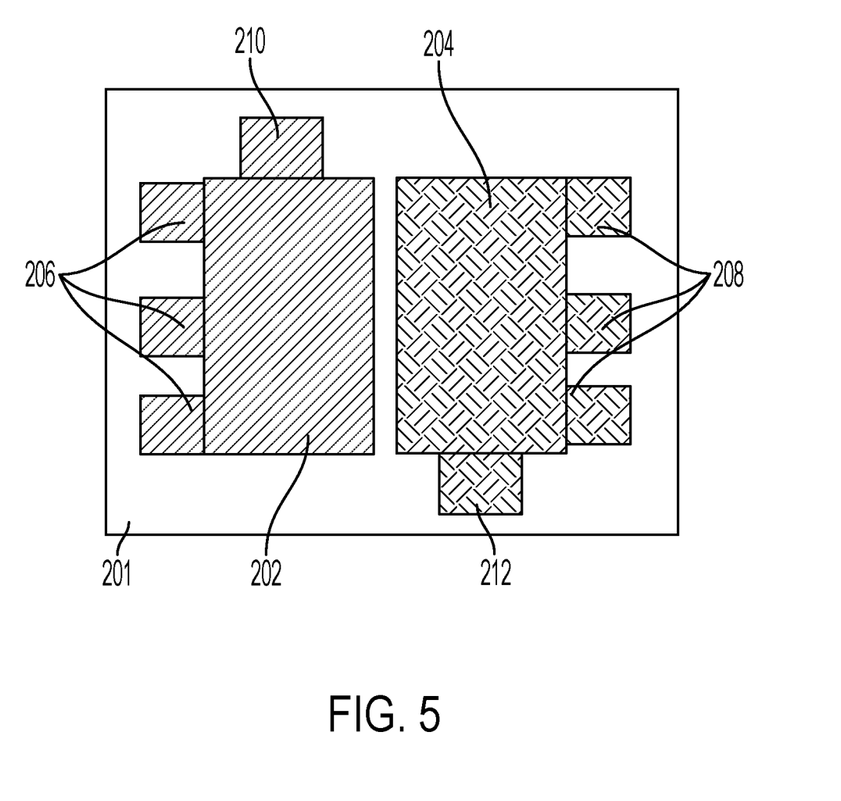
FIG. 5 is a plan view of two chips on a wafer, with each chip including a peripheral component interconnect (PCI).

FIG. 5 illustrates a first chip 202 and a second chip 204 on a substrate 201. The first chip 202 includes a number of first chip protruding portions 206. The second chip 204 includes a number of second chip protruding portions 208.

The first chip 202 includes and is attached to a first PCI (peripheral component interconnect) 210. The second chip 204 includes and is attached to a second PCI 212.

The first PCI 210 is connected to the first chip 202, and the second PCI 212 is connected to the second chip 204, in any suitable way, such as by a mechanical and electrical coupling to the substrate 201 using a solder bump connection.

The inclusion of the first PCI 210 with the first chip 202 and the second PCI 212 with the second chip 204 increases communication between the first chip 202 and the substrate 201 and increases communication between the second chip 212 and the substrate 201.

All substantially square corners, including corners of the first chip protruding portions 206; corners of the second chip protruding portions 208; corners of the first PCI 210; corners of the second PCI 212; corners of the first chip 202; corners of the second chip 204; and all substantially square corners formed by edges of the first chip protruding portions 206 and the first chip 202; the first PCI 210 and the first chip 202; the second PCI 212 and the second chip 204; and the second chip protruding portion 208 and the second chip 204 can be formed as being substantially curved, or can be modified to become substantially curved.

Figure 6:
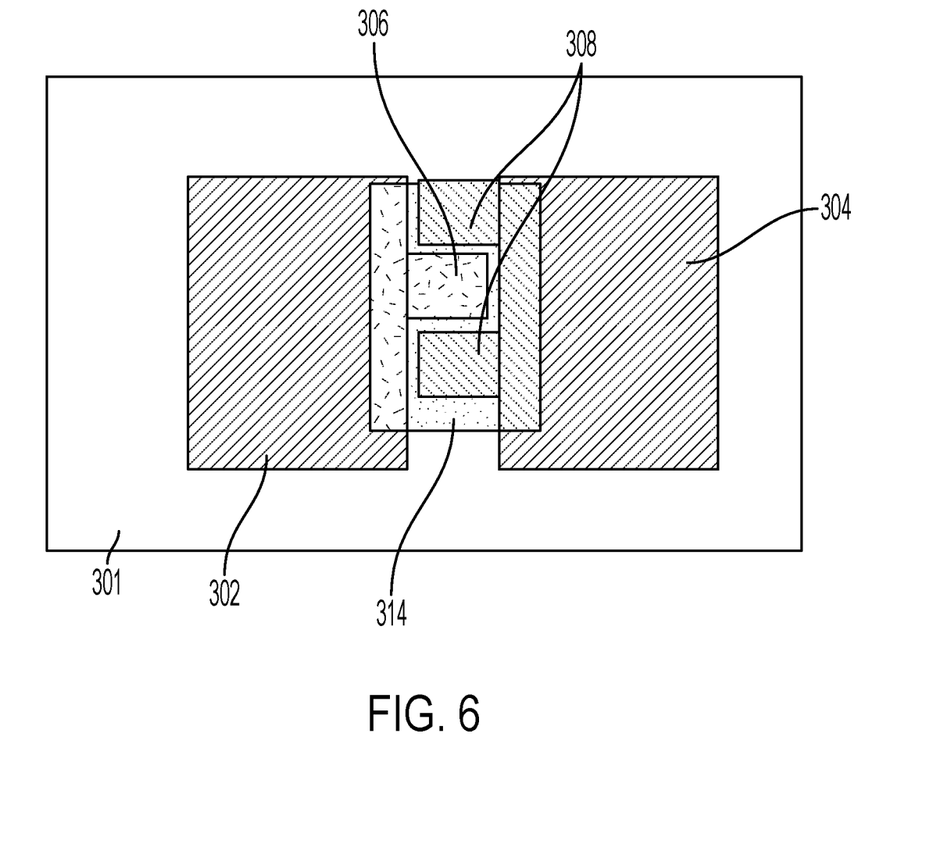
FIG. 6 is a plan view of two interdigitated chips on a wafer, with a bridge connecting the two chips.

FIG. 6 illustrates a first chip 302 and a second chip 304 on a substrate 301. The first chip 302 and the second chip 304 are attached to the substrate 301 in any suitable way, such as by a mass solder reflow process or by thermal compression bonding.

As can be seen, the second chip 304 includes two fin protruding portions 308. Also, the first chip 302 includes a fin protruding portion 306. In this embodiment a single fin protruding portion 306 is shown, but in other embodiments, two or more fin protruding portions may be included with the first chip 302. In this embodiment two fin protruding portions 308 are shown, but in other embodiments, one, three or more fin protruding portions may be included with the second chip 304.

Thus, the first chip 302 and the second chip 304 are interdigitated due to their respective locations and the locations of the first fin protruding portion 306 with respect to the second fin protruding portions 308.

In addition to the first chip 302 and the second chip 304 on the substrate 301, a bridge 314 is also included. In this view the bridge 314 is shown as transparent or substantially transpired for illustrative purposes. In other embodiments, bridge 314 can be opaque or substantially opaque.

The bridge 314 can be any suitable material, including silicon, materials including silicon or any other semiconductor materials, organic, glass or ceramic. The bridge 314 can be connected to both of the first chip 302 and the second chip 304 through solder balls, copper to copper connections or any other suitable connection mechanism. Also, the bridge 314 can be any suitable thickness, including thicker than each of the first chip 302 and the second chip 304, substantially the same thickness as one of the first chip 302 and the second chip 304, or thinner than one of the first chip 302 and the second chip 304.

The bridge 314 can be attached to the first chip 302 and the second chip 304 through an alignment process that aligns the orientation of the bridge 314 to the orientation of the first chip 302 and the second chip 304, so that the bridge 304 is substantially covering the interdigitated first chip protruding portion 36 and the second chip protruding portions 308. Once the bridge 314 is in the desired location, it can be attached to the first chip 302 and the second chip 304 in any suitable way, such as by a mass solder reflow method.

The location on a relatively large substrate of any of the above embodiments can be any suitable location, including within 50 microns of a corner and/or edge of each chip. Any portions of any chip between 10 to 1,000 microns of a corner and/or edge of each chip can include an underfill material that creates a mechanical connection between adjacent chips to reduce stress effects typically imparted upon the edge interconnects due to differences in thermal coefficient of expansion between the chips and the substrate.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a first chip on a wafer and having at least one first protruding section and a first chip receiving section, the first protruding section comprising first interconnect locations, wherein the at least one first protruding section extends from an edge of the first chip at an angle of about 45°; and
   a second chip on the wafer and having at least one second protruding section and a second chip receiving section, the second protruding section comprising second interconnect locations, wherein the at least one second protruding section extends from an edge of the second chip at an angle of about 45°,
   wherein the first chip receiving section comprises three edges, and the second chip receiving section comprises three edges,
   wherein the first chip and the second chip are arranged such that the first protruding section is interdigitated with the second protruding section, wherein at least a portion of at least one of the first chip and the second chip is within 50 to 500 microns of a corner of the other chip or within 50 to 500 microns of an edge of the other chip.

2. The semiconductor of claim 1, wherein a corner of at least one of the first chip, the second chip, the first protruding section and the second protruding section is curved.

3. A semiconductor structure comprising:
a substrate;
a first chip on the substrate having at least one first protruding section, wherein the first chip comprises a first chip first edge and a first chip second edge that is different than the first chip first edge, the first protruding section comprising first interconnect locations on the first chip first edge; and
a second chip on the substrate having at least one second protruding section, wherein the second chip comprises a second chip first edge and a second chip second edge that is different than the second chip first edge, the second protruding section comprising second interconnect locations on the second chip first edge,
wherein the first chip comprises a first PCI (peripheral component interconnect) on the first chip second edge and the second chip comprises a second PCI on the second chip second edge, and wherein the first PCI is connected to the first chip and is coupled to the substrate.

4. The semiconductor structure of claim 3, wherein at least a portion of at least one of the first chip and the second chip is within 50 to 500 microns of a corner of the other chip or within 50 to 500 microns of an edge of the other chip.

5. The semiconductor structure of claim 3, wherein a corner of at least one of the first chip, the second chip, the first protruding section and the second protruding section is curved.

6. The semiconductor structure of claim 3, wherein corners of the first PCI are curved and wherein corners of the second PCI are curved.

7. The semiconductor structure of claim 3, wherein second PCI is connected to the second chip and is coupled to the substrate.

8. A semiconductor structure comprising:
a first chip on a substrate and having at least one first protruding section, the first protruding section comprising first interconnect locations, wherein the first protruding section comprises a first protruding section upper surface opposite to a first protruding section lower surface, and wherein the first protruding section lower surface is on the substrate;
a second chip on the substrate and having at least one second protruding section, the second protruding section comprising second interconnect locations, wherein the second protruding section comprises a second protruding section upper surface opposite to a second protruding section lower surface, and wherein the second protruding section lower surface is on the substrate; and
a bridge connected to the first chip and connected to the second chip through a connection selected from the group consisting of solder balls and copper to copper connections, wherein the bridge is aligned to the orientation of the first chip and the second chip,
wherein the first chip and the second chip are arranged such that the first protruding section is interdigitated with the second protruding section, and wherein the bridge substantially covers the interdigitated first protruding section upper surface of the at least one first protruding section and the second protruding section upper surface of the at least one second protruding section.

9. The semiconductor structure of claim 8, wherein at least a portion of at least one of the first chip and the second chip is within 50 to 500 microns of a corner of the other chip or within 50 to 500 microns of an edge of the other chip.

10. The semiconductor structure of claim 8, wherein a corner of at least one of the first chip, the second chip, the first protruding section and the second protruding section is curved.

* * * * *